(12) United States Patent
Chun et al.

(10) Patent No.: US 8,625,300 B2
(45) Date of Patent: Jan. 7, 2014

(54) CIRCUIT MANUFACTURING AND DESIGN TECHNIQUES FOR REFERENCE PLANE VOIDS WITH STRIP SEGMENT

(75) Inventors: Sungjun Chun, Austin, TX (US); Anand Haridass, Austin, TX (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,761

(22) Filed: Sep. 5, 2012

(65) Prior Publication Data

US 2012/0331430 A1    Dec. 27, 2012

Related U.S. Application Data

(62) Division of application No. 12/823,316, filed on Jun. 25, 2010, now Pat. No. 8,325,490, which is a division of application No. 12/015,543, filed on Jan. 17, 2008, now Pat. No. 7,821,796.

(51) Int. Cl.
*H05K 1/14* (2006.01)

(52) U.S. Cl.
USPC ........... 361/795; 361/748; 361/760; 361/761; 174/255; 174/260; 174/261; 174/262

(58) Field of Classification Search
USPC .................. 361/795, 748, 760, 761; 174/255, 174/260–262
See application file for complete search history.

(56) References Cited

U.S. PATENT DOCUMENTS

| | | | |
|---|---|---|---|
| 5,214,000 A | 5/1993 | Chazan et al. | |
| 5,396,034 A | 3/1995 | Fujita et al. | |
| 6,339,197 B1 | 1/2002 | Fushie et al. | |
| 6,353,917 B1 | 3/2002 | Muddu et al. | |
| 6,506,982 B1 | 1/2003 | Shigi et al. | |
| 6,789,241 B2 | 9/2004 | Anderson et al. | |
| 6,938,336 B2 | 9/2005 | Ito et al. | |
| 7,045,719 B1* | 5/2006 | Alexander et al. | 174/262 |
| 7,057,115 B2 | 6/2006 | Clink et al. | |
| 7,084,355 B2 | 8/2006 | Kosaka et al. | |
| 7,129,574 B2 | 10/2006 | Wu | |
| 7,196,906 B1 | 3/2007 | Alexander et al. | |
| 7,197,736 B2 | 3/2007 | Saxena et al. | |

(Continued)

OTHER PUBLICATIONS

U.S Appl. No. 11/751,786, filed May 22, 2007, Chun, et al.

(Continued)

*Primary Examiner* — Xiaoliang Chen

(74) *Attorney, Agent, or Firm* — Mitch Harris, Atty at Law, LLC; Andrew Mitch Harris; Matthew W. Baca

(57) ABSTRACT

Manufacturing circuits with reference plane voids over vias with a strip segment interconnect permits routing critical signal paths over vias, while increasing via insertion capacitance only slightly. The transmission line reference plane defines voids above (or below) signal-bearing plated-through holes (PTHs) that pass through a rigid substrate core, so that the signals are not degraded by an impedance mismatch that would otherwise be caused by shunt capacitance from the top (or bottom) of the signal-bearing PTHs to the transmission line reference plane. In order to provide increased routing density, signal paths are routed over the voids, but disruption of the signal paths by the voids is prevented by including a conductive strip through the voids that reduces the coupling to the signal-bearing PTHs and maintains the impedance of the signal path conductor.

2 Claims, 7 Drawing Sheets

(56) References Cited

U.S. PATENT DOCUMENTS

| | | |
|---|---|---|
| 7,249,337 B2 | 7/2007 | Gisin et al. |
| 7,361,994 B2 | 4/2008 | Ye |
| 7,402,757 B1 | 7/2008 | Noujeim |
| 7,448,880 B2 | 11/2008 | Osaka |
| 7,457,132 B2 | 11/2008 | Gisin et al. |
| 7,583,513 B2 | 9/2009 | Boggs et al. |
| 7,646,082 B2 | 1/2010 | Chun et al. |
| 7,765,504 B2 | 7/2010 | Douriet et al. |
| 2003/0072130 A1 | 4/2003 | Tsang et al. |
| 2003/0147375 A1 | 8/2003 | Goergen et al. |
| 2003/0177638 A1 | 9/2003 | Goergen |
| 2003/0179049 A1 | 9/2003 | Goergen |
| 2003/0179532 A1 | 9/2003 | Goergen |
| 2003/0179741 A1 | 9/2003 | Goergen |
| 2004/0169198 A1* | 9/2004 | Nagata et al. ............ 257/200 |
| 2004/0176938 A1 | 9/2004 | Gisin et al. |
| 2004/0238942 A1 | 12/2004 | Chakravorty et al. |
| 2005/0017357 A1 | 1/2005 | Iida et al. |
| 2005/0023241 A1 | 2/2005 | Goergen |
| 2005/0063166 A1 | 3/2005 | Boggs et al. |
| 2006/0043572 A1* | 3/2006 | Sugimoto et al. ............ 257/700 |
| 2006/0091545 A1 | 5/2006 | Casher et al. |
| 2006/0118332 A1 | 6/2006 | Benham |
| 2006/0199390 A1* | 9/2006 | Dudnikov et al. ............ 438/700 |
| 2006/0283547 A1 | 12/2006 | Yuri et al. |
| 2007/0029106 A1* | 2/2007 | Kato ............................ 174/255 |
| 2007/0039171 A1 | 2/2007 | Goergen |
| 2007/0064375 A1* | 3/2007 | Urashima et al. ............ 361/311 |
| 2008/0049410 A1 | 2/2008 | Kawaguchi et al. |
| 2008/0066951 A1 | 3/2008 | Goergen |
| 2008/0075070 A1 | 3/2008 | Goergen |
| 2008/0107863 A1* | 5/2008 | Ikeda et al. .................. 428/137 |
| 2008/0227311 A1 | 9/2008 | Chan et al. |
| 2008/0273311 A1 | 11/2008 | Biunno |
| 2008/0290474 A1* | 11/2008 | Chun et al. .................... 257/664 |
| 2009/0031270 A1 | 1/2009 | Douriet et al. |
| 2009/0193380 A1 | 7/2009 | McElvain et al. |

OTHER PUBLICATIONS

Office Action in U.S. Appl. No. 12/015,543 on Mar. 24, 2010.
Notice of Allowance in U.S. Appl. No. 12/015,543 on Jun. 16, 2010.
Office Action in U.S. Appl. No. 12/823,316 on Apr. 13, 2012.
Notice of Allowance in U.S. Appl. No. 12/823,316 on Jul. 26, 2012.

* cited by examiner

CIRCUIT MANUFACTURING AND DESIGN TECHNIQUES FOR REFERENCE PLANE VOIDS WITH STRIP SEGMENT

CROSS-REFERENCE TO RELATED APPLICATIONS

The present U.S. patent application is a Division of U.S. patent application Ser. No. 12/823,316 filed on Jun. 25, 2010, now U.S. Pat. No. 8,325,490 which is a division of U.S. patent application Ser. No. 12/015,543 filed on Jan. 17, 2008 now U.S. Pat. No. 7,821,796. The present U.S. patent application is also related to U.S. patent application Ser. No. 11/751,786 entitled "MULTI-LAYER CIRCUIT SUBSTRATE AND METHOD HAVING IMPROVED TRANSMISSION LINE INTEGRITY AND INCREASED ROUTING DENSITY", filed on May 22, 2007 by the same inventors and assigned to the same Assignee, and issued as U.S. Pat. No. 7,646,082 on Jan. 12, 2010. The disclosures of the above-referenced U.S. patent applications are incorporated herein by reference.

BACKGROUND OF THE INVENTION

1. Technical Field

The present invention relates generally to integrated circuit internal package interconnects, and more particularly, to a methodology and multi-layer substrate that has improved signal integrity and impedance matching.

2. Description of the Related Art

High-density interconnect schemes for processor packages, as well as other very-large-scale integrated (VLSI) circuits typically use a large number of circuit layers to connect one or more dies to electrical terminals disposed on one or more surfaces of the package, as well as to interconnect multiple dies in multi-die packages.

A typical stack-up for a present-day VLSI circuit substrate is fabricated in very thin layers on one or both sides of a rigid core that provides stiffness and stability to integrated circuit substrates, which may then be encapsulated after dies are attached. The core typically includes pass-through vias that have a larger diameter than the vias used between the thin circuit layers and that pass between thin insulating layers. For example, in a substrate having a core 800 μm thick, the diameter of the through vias may be 500 μm in diameter, while the outer layer interconnects may have vias only 50 μm in diameter. The reason for the larger diameter holes through the core is the relative thickness of the core, which makes reliable fabrication and resin/conductive filling of the vias more difficult than for vias between the thin insulating layers in the outer circuit layers that are laminated on the core.

Since the interconnect routing density directly determines the required size of the final package, routing resources are critical in an integrated circuit package and space is at a premium. However, for critical signal paths such as clock and high-speed logic signal distribution, transmission lines must be maintained throughout the signal path in order to prevent signal degradation. Therefore, a reference voltage plane (e.g., ground) metal layer is provided on the surface of the core, with voids around the via and interconnect areas at the surface(s) of the core so that a transmission line is provided for the next signal layer above/below the core surface metal layer(s). As a result, signal path conductors must be routed around the large diameter vias passing through the core which are not connected to the metal layer. Further, the signal path conductors must also be routed away from discontinuities in the metal layers(s) caused by the voids through which the vias pass, since the lack of reference voltage plane metal will cause a change in impedance of the transmission line. Therefore, the number of signal routing channels is severely limited by the presence of the large-diameter vias that extend through the core that provide signal paths, and the large-diameter vias that provide voltage planes other than the voltage plane connected to the core surface metal layer.

The above-incorporated U.S. patent application provides additional routing channels by providing continuous reference plane metal adjacent to conductive signal paths, and frees additional signal routing channels over reference voltage vias by providing reference plane metal between the ends of the vias and any signal paths routed above or below the via ends. Disruption of signals carried by signal-bearing vias is avoided by providing voids in the reference plane metal above or below the ends of the signal-bearing vias. However, in such designs, routing is still critically limited by the inability to route signal paths over the signal-bearing vias.

It is therefore desirable to provide a multi-layer integrated circuit, substrate and method that maintain signal integrity and impedance matching in an integrated circuit package while providing an increased amount of signal routing channels, including channels routed over signal-bearing vias.

SUMMARY OF THE INVENTION

The objective of improving signal integrity and impedance matching in a multi-layer integrated circuit substrate while permitting routing over signal bearing vias is provided in an integrated circuit substrate, and methods for making and designing the integrated circuit substrate.

The substrate includes a core having large diameter vias and at least one signal layer having signal conductors having a width substantially smaller than the diameter of the large diameter vias. The signal conductors are connected to large diameter vias by a small diameter portion passing through a first insulating layer disposed between the core and a transmission line reference plane metal layer, and a second insulating layer disposed between the transmission line reference plane metal layer and the signal layer.

The transmission line reference plane metal layer defines voids having an area larger than the area of signal-bearing large diameter vias, so that the presence of the transmission line reference plane metal layer does not cause substantial insertion capacitance with respect to critical signals. For signal-bearing vias over which critical signal paths are routed, a conductive stripe extends across the voids to isolate the critical signal conductive paths from the ends of the signal-bearing vias. The width of the stripes may be equal to the width of the critical signal conductive paths, or the width may be determined by the relative criticality of the signals. The more critical the signal borne by the conductive path is to the signal borne by the conductive via, the wider the stripe and vice-versa.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns integrated circuit package substrates and methods of designing and making the substrates provide for routing of conductive signal paths over signal-bearing vias, while solving impedance matching and isolation problems associated with prior art substrates. As in the above-incorporated U.S. patent application "MULTI-LAYER CIRCUIT SUBSTRATE AND METHOD HAVING IMPROVED TRANSMISSION LINE INTEGRITY AND INCREASED ROUTING DENSITY", metal reference planes are used to provide transmission line characteristics for signal paths and voids are included in the metal reference planes over signal-bearing vias to prevent insertion capacitance mismatches. However, in the present invention, voids over which conductive signal paths are routed include conductive "stripes" extending across the vias in line with the conductive signal path, effectively splitting the voids into two voids (or more if multiple signal paths are routed over the via, as a strip could be provided for each signal path). The stripes also reduce cross-coupling between the signal path and the via, as the fields associated with the signal path are more contained due to the presence of the stripe.

The stripe width is generally equal to that of the conductive signal path, but may be altered to reduce fringing effects on impedance or may be tailored to the relative criticality of the individual signals on the via and the conductive signal path. Since the ideal condition for proper impedance matching along the conductive signal path is the absence of any void at all, and the ideal condition for eliminating insertion capacitance at the ends of the void is the absence of the metal reference plane (or at least a complete void), the present invention involves a trade-off between preserving the signal on the conductive signal path and preserving the signal on the signal-bearing via. Therefore, since the width of the stripe is proportional to the performance of one signal and inversely proportional to the other signal, the relative criticality of the signals can be used to determine the appropriate width.

The stripe is also generally centered in the void (or, in other terms, between the two partial voids formed by splitting the void), but that is not a limitation of the present invention. Signal routing considerations may require an offset from a central diameter of the void, or the direction of the signal path and stripe may change as the signal crosses the void. In general, the shape and position of the stripe may reflect any shape and position of the conductive signal path in order to maintain a level of impedance matching that is improved over the performance obtainable in the absence of the stripe.

Figure 1A:
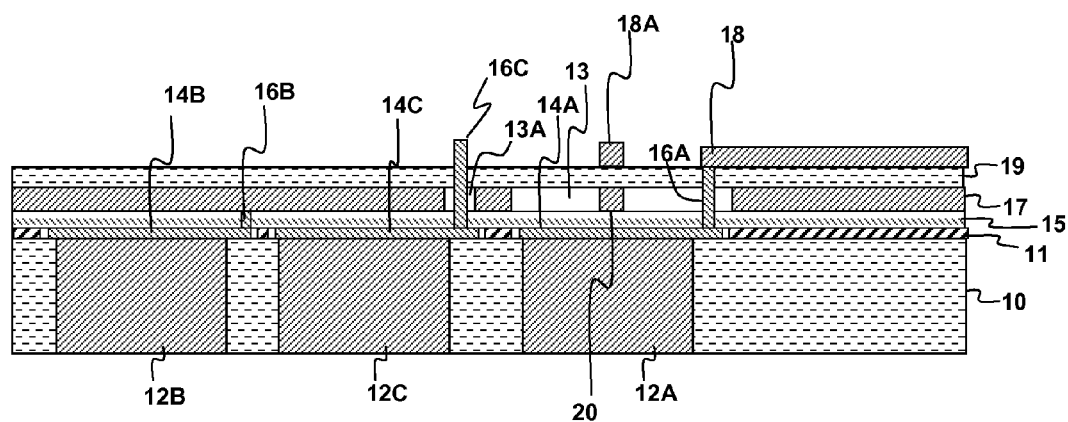
FIG. 1A is a cross-sectional view of a substrate in accordance with an embodiment of the present invention.

Referring now to FIG. 1A, an integrated circuit package substrate in accordance with an embodiment of the present invention is shown. The substrate includes a core 10 including through-via conductors provided by resin-filled plated-through hole (RFPs) 12A-12C. Metal layers are formed by plating, deposition or laminating on both sides of core 10 containing jog stubs 14A-14C and areas of reference voltage plane layer 11, with an insulating layer 15 laminated above stubs 14A-14C and reference voltage plane layer 11. A transmission line reference plane metal layer 17 is laminated, or otherwise deposited, above insulating layer 15 and a second insulating layer 19 is laminated, or otherwise deposited, above transmission line reference plane metal layer 17. A signal layer including signal path conductors 18 is laminated or otherwise deposited above insulating layer 19. For each critical signal-bearing RFP 12A, large-diameter voids 13 in transmission line reference plane metal layers 17 are provided above and below ends of signal-bearing RFPs 12A, which reduces the shunt capacitance from signal-bearing RFP 12A to transmission line reference plane metal layers 17. In the present invention, a stripe 20 extends across the void 13 above signal-bearing RFP 12A, which provides some shunt (insertion) capacitance, as mentioned above. However, stripe 20 reduces coupling between a signal path conductor 18A that is routed above signal-bearing RFP 12A, and further provides a much-improved impedance profile to signal path conductor 18A.

While the void portions surrounding stripe 20 are devoid of metal, in practice, the void portions will generally be filled with dielectric, lamination adhesive or other non-conductive material.

Signal-bearing RFPs 12A are connected to signal path conductors 18 by stubs 14A and small-diameter vias 16A. Without large diameter voids 13, the shunt capacitance from the ends of signal-bearing RFP 12A to transmission line reference plane metal layers 17 will cause signal degradation greater than that caused by the presence of stripe 20. Voltage plane RFPs 12B and 12C (and optionally RFPs bearing non-critical signals) have no corresponding large-diameter voids in transmission line reference plane metal layer 17, which increases their distributed capacitance by the shunt capacitance from RFPs 12B, 12C to transmission line reference plane metal layer 17, which is generally desirable. Therefore, the stripes of the present invention are generally used over signal-bearing vias, and generally only when a conductive signal path is routed over a signal-bearing via.

Reference plane RFP 12B, which corresponds to the voltage plane to which transmission line reference plane metal layer 17 is connected, has a stub 14B connecting to transmission line reference plane metal layer 17 through a small via 16B. Blind vias connected to transmission line reference plane metal layer 17 can further be used in connections to signal path layers added above the layer containing signal conductors 18, to provide electrical connection to the particular voltage plane connected to transmission line reference plane metal layer 17, if needed. Therefore, no void (and therefore, no stripe) is needed in transmission line reference plane metal layer 17 above reference plane RFP 12B. Other voltage plane RFPs 12C will generally require formation of vias 16C extending to other layers above transmission line reference plane metal layer 17 from stubs 14C. Small-diameter voids 13A provide connection to other voltage plane RFPs 12C and extend only above the ends of stubs 14C, for signal routing channels above transmission line reference plane metal layer 17 above the top ends (and beneath the bottom ends for layers applied beneath core 10, not specifically shown) of other voltage plane RFPs 12C. The voltage plane used to provide a reference to transmission line reference plane metal layer 17 may be a power supply voltage supplying the input/output drivers (the I/O signal reference and/or return voltage) or ground.

Figure 1B:
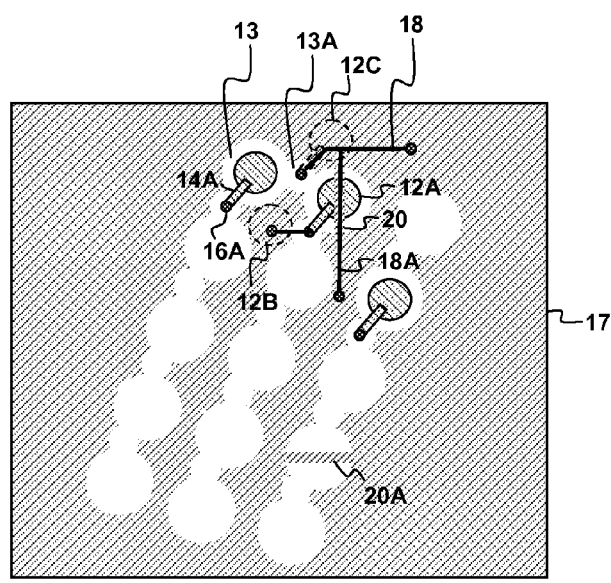
FIG. 1B is top view of the substrate of FIG. 1A.

Referring now to FIG. 1B, a top view of the integrated circuit package substrate of FIG. 1A is shown. Voids 13 are defined by transmission line reference plane metal layer 17, with additional metal removed above signal path stubs 14A and small diameter voids 13A for vias 16A that connect signal path stubs 14A to other signal layers. The resulting integrated circuit package substrate has improved isolation between signal path conductors 18 routed over the continuous portions of transmission line reference plane metal layer 17, while eliminating the shunt capacitance from signal-bearing RFPs 12A to metal layer 17, when no stripe is present and reducing the shunt capacitance when a stripe is present. Large diameter via 12A is illustrated with a conductive signal path 18A routed above and a stripe 20 included in void 13B. Stripe 20 has been widened slightly for illustrative purposes, and another strip 20A is shown without a corresponding conductive path or via for clarity.

Thus, in the present invention increased routing channels are provided in the regions extending over the top ends (or bottom ends) of all of RFPs 12A, 12B and 12C. Thus, the substrate of the present invention provides improved signal performance in signal paths, providing for higher processor or other VLSI circuit operating frequencies, while providing increased routing flexibility by providing more routing channels that can have adequate signal performance no matter whether signal paths are routed above core RFPs that carry power distribution and/or non-critical signals as described in the above-incorporated U.S. patent application, or routed above signal bearing RFPs such as RFP 12A.

Figure 2A:
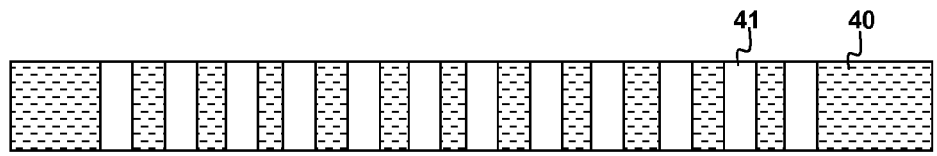
FIGS. 2A-2G are cross sectional views illustrating steps in the manufacture of a substrate in accordance with an embodiment of the present invention.
Figure 2B:
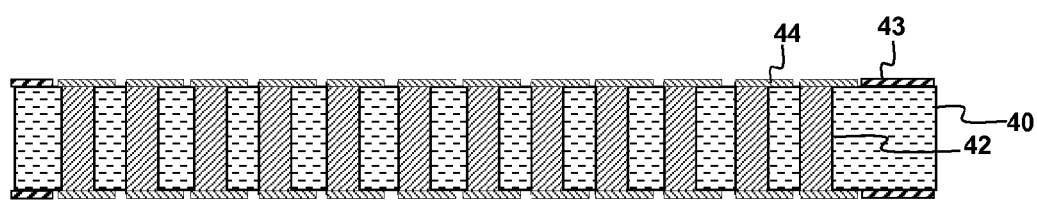
Figure 2C:
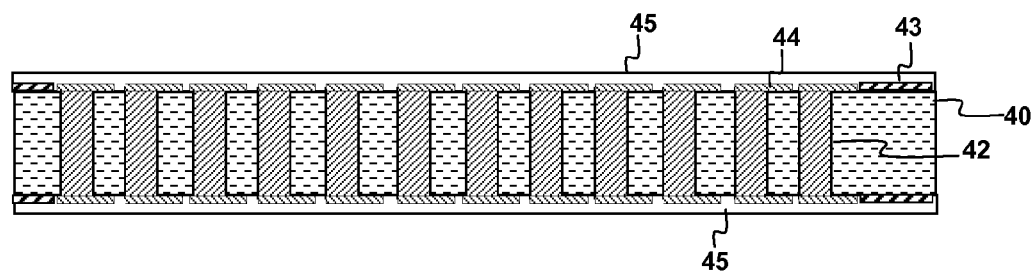
Figure 2D:
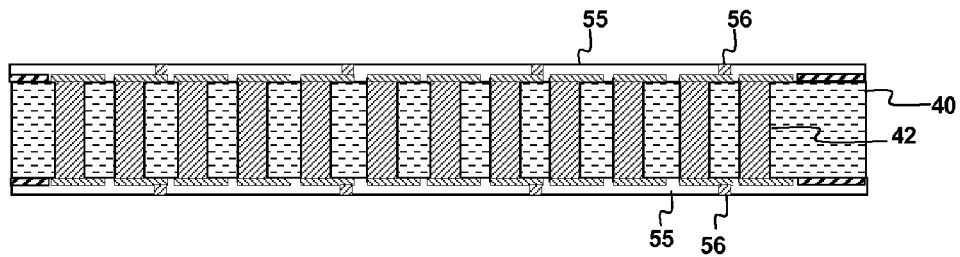
Figure 2E:
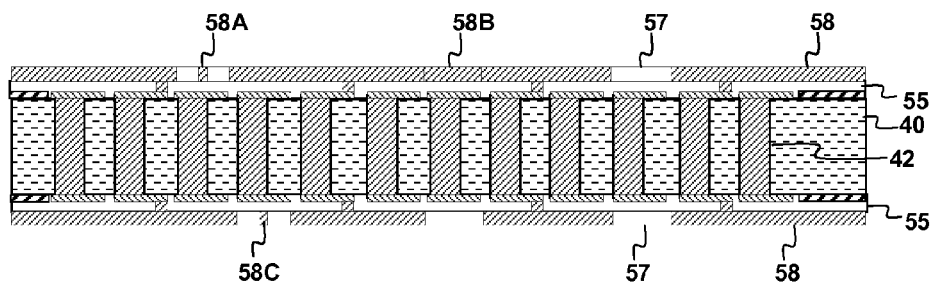
Figure 2F:
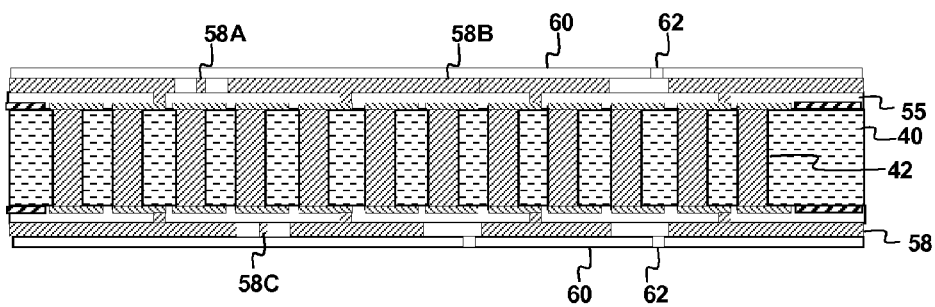
Figure 2G:
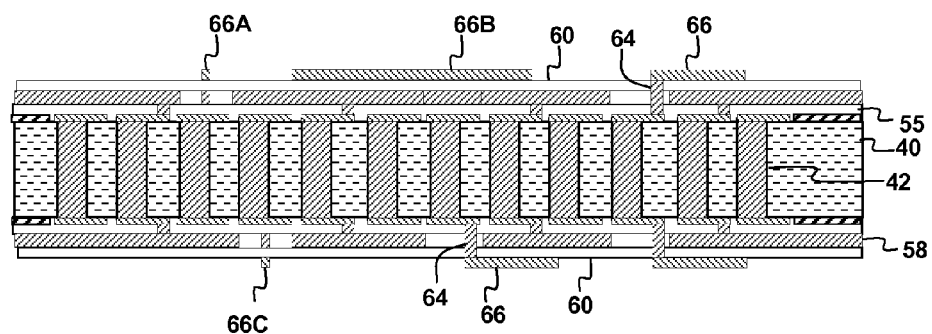

Referring now to FIGS. 2A-2G, a method of making an integrated circuit substrate and integrated circuit in accordance with an embodiment of the invention is shown. As shown in FIG. 2A, starting from a core dielectric layer 40 having via holes 41 formed therein, holes 41 are filled with resin/metal to form PTHs 42. Stubs 44 and reference plane areas 43 are formed on both surfaces of core 40, as shown in FIG. 2B. An insulating layer 45 is then applied to one or both sides of the core dielectric layer 40, over stubs 44 as shown in FIG. 2C. Next, insulating layer 45 is opened to generate small-diameter via holes, forming insulating layer 55. Then, metal is added in the small-diameter via holes to form small vias 56 to connect to voltage plane RFPs as shown in FIG. 2D. Next, a transmission line reference plane metal layer 58 with voids 57 and stripes 58A-58C is applied as shown in FIG. 2E. Stripes 58A and 58C illustrate stripe for conductive paths extending perpendicular to the page of the Figure, and stripe 58B illustrates a stripe for a conductive path extending along the plane of the Figure. Voids 57, including the void portions around stripes 58A-58C will generally be filled with dielectric insulating material or lamination adhesive as described above. Both the insulating layer 55 and transmission line reference plane metal layer 58 may be applied as laminates, or the insulating layer may be deposited and/or transmission line reference plane metal layer 58 may be plated atop insulating layer 55. Voids 57 and stripes 58A-58C may be pre-formed in transmission line reference plane metal layer 58 or etched. Next, as shown in FIG. 2F, another insulating layer 60 is applied in a manner similar to that for insulating layer 55, and small voids 62 are formed or pre-formed in insulating layer 60 for connection to signal RFPs. Finally, blind vias 64 and a signal layer 66 are formed as shown in FIG. 2G that provide electrical connection to signal RFPs. Conductive signal path 66A corresponding to stripe 58A, conductive signal path 66B corresponding to stripe 58B and conductive signal path 66C corresponding to stripe 58C are also shown, which form part of signal layer 66. Blind vias 64 and signal layer 66 may be formed at the same time, for example, by plating, or blind vias 64 may be formed first by filling or plating and then signal layer 66 laminated or plated to connect to blind vias 64.

Figure 2H:
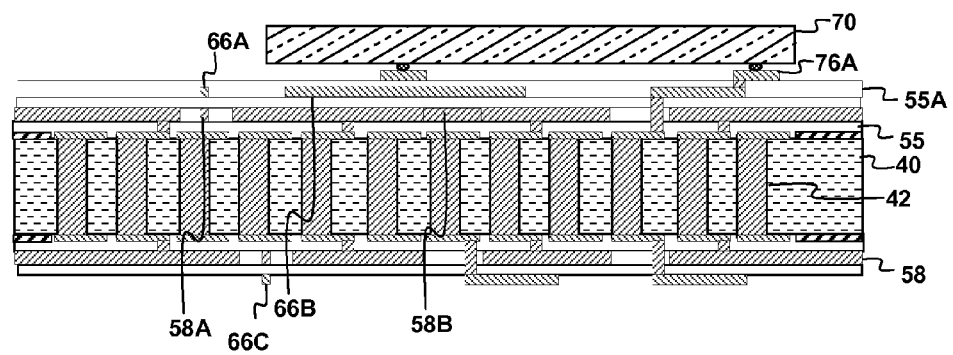
FIG. 2H is a cross sectional view of an integrated circuit package in accordance with an embodiment of the present invention.

Referring now to FIG. 2H, an integrated circuit in accordance with an embodiment of the present invention is shown. The substrate of FIG. 2G is further modified by adding further signal layers, and optionally voltage plane layers on one or both sides of the core dielectric layer 40. As illustrated another insulating layer 55A and signal layer 76A are added, but in practice, numerous other layers may be added. A semiconductor die 70 is attached to lands or other structures accessible from the top layer of the substrate shown in FIG. 2G and terminals or lands (not shown) may similarly be added to the bottom side of the substrate after other circuit layers are added. Alternatively, lands can be formed directly on the bottom side of core dielectric layer 40 or terminals may be attached to the bottom side of RFPs 42.

Figure 3:
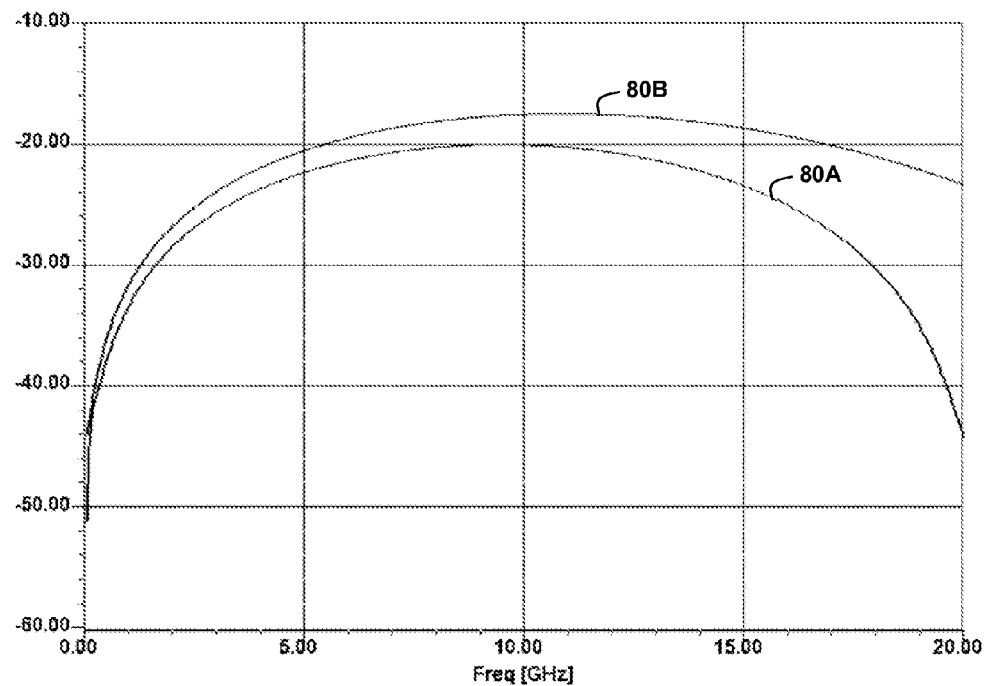
FIG. 3 is a graph depicting a reflectometer display depicting a performance improvement provided by the substrate of the present invention.
Figure 4:
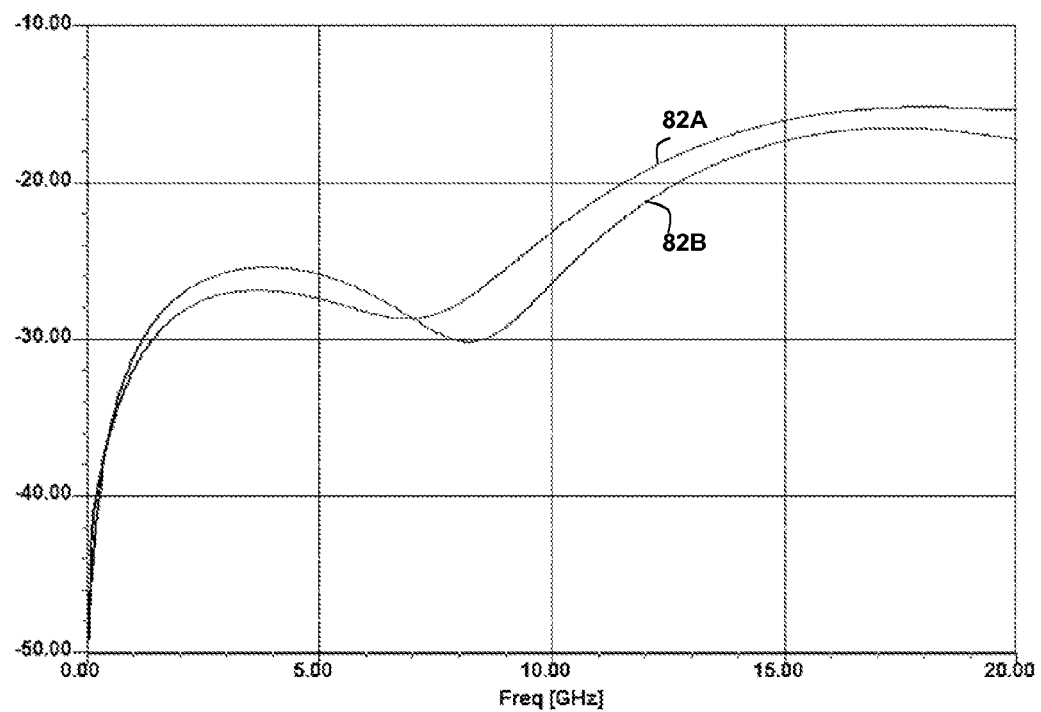
FIG. 4 is a graph depicting a reflectometer display depicting the effect of conductive strips of the substrate of the present invention on signal-bearing via performance.

Referring now to FIG. 3 and FIG. 4, performance benefits and trade-offs of the present invention are shown. FIG. 3 illustrates a reflection trace 80A representing performance of a 28 μm wide conductive signal path routed over a via that is 150 μm in diameter and including a 28 μm wide stripe under the conductive signal path. An improvement of 3 dB at 10 GHz is shown (in reduction of reflection) over reflection trace 80B, which is for the same configuration without the stripe. However, as mentioned above, including the stripe changes the performance of the signal-bearing via. FIG. 4 illustrates a reflection trace 82A for the configuration including the stripe, which is approximately 3 dB higher in reflection at 10 GHz for the configuration without the stripe, which is illustrated by reflection trace 82B. However, as is noted from the Figures, the effect of the void/via on performance of the signal path routed over the via is greater than the effect of the stripe on the performance of the signal path that includes the via. Therefore, absolute reflection level and improvement should be taken into account in any design, as well as optionally the relative criticality of the signals.

Figure 5:
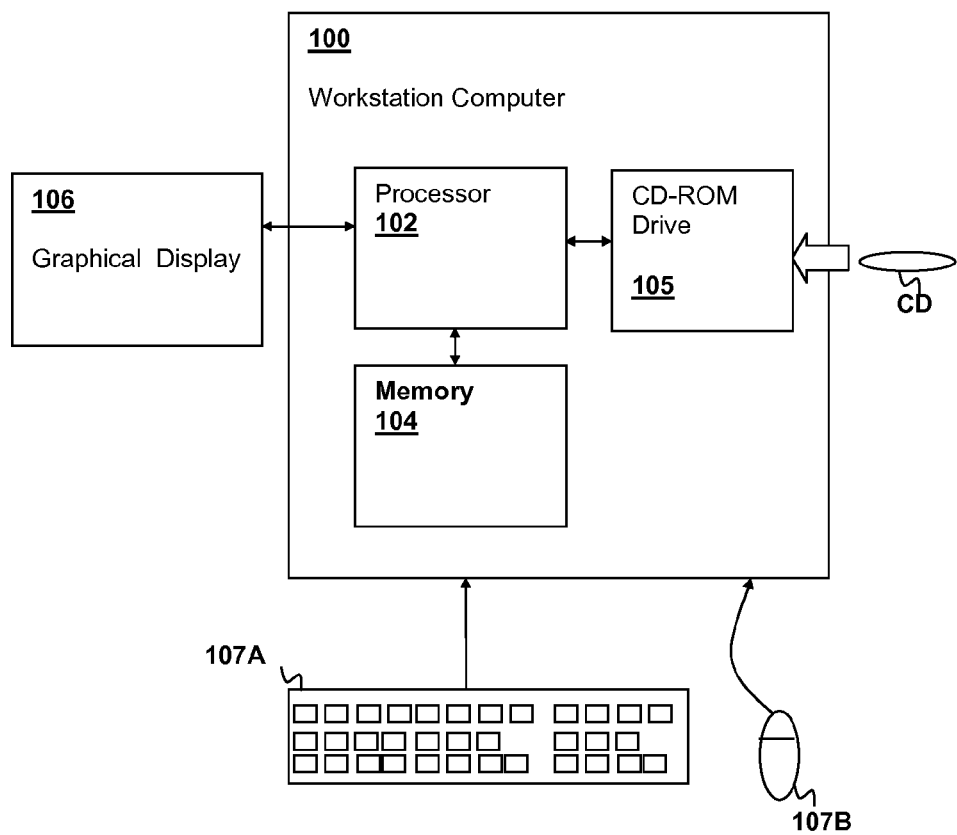
FIG. 5 is a pictorial diagram depicting a workstation computer system by which design methods and computer program products are executed in accordance with an embodiment of the present invention.

Referring now to FIG. 5, a workstation computer system 100 is shown in which the methods of the present invention are carried out in accordance with an embodiment of the present invention, according to program instructions that may be embodied in a computer program product in accordance with a present invention, for example program instructions stored on a CD-ROM disc CD. Workstation computer system includes a processor 102 for executing the program instructions coupled to a memory 104 for storing the program instructions, data and results used in designing integrated circuit substrates in accordance with embodiments of the present invention. Workstation computer system 100 also includes peripheral devices such as CD-ROM drive 105 for reading discs such as CD in order to load the program instructions into workstation computer 100. Input devices, such as a keyboard 107A and a mouse 107B are coupled to workstation computer system 100 for receiving user input. A graphical display 106 for displaying results such as the layout of metal layer 17 of FIGS. 1A-1B, substrate layer designs as illustrated in FIGS. 2A-2G and test data or simulations such as that of FIGS. 3-4. The depicted workstation computer 100 is only exemplary and illustrates one type of computer system and arrangement suitable for carrying out the design methods of the present invention. The design methods generally identify the locations of signal bearing vias and generate a mask design for a transmission line reference plane metal layer that includes voids around the profile of the signal-bearing vias so that capacitive coupling between the ends of the signal-bearing vias and the transmission line reference plane metal layer is substantially reduced. The locations of conductive signal paths routed over the signal-bearing vias is also identified and stripes inserted to reduce coupling and match impedance of the conductive signal path. The design methods may also consider the relative criticality of signals on the signal-bearing voids and conductive signal path and adjust the width of the stripes to optimize trade-offs in performance.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer program product comprising a computer-readable device storing program instructions, wherein the program instructions are program instructions for designing layers of a substrate for mounting and interconnecting a semiconductor die, and wherein the program instructions comprise:

program instructions for first identifying locations of signal-bearing vias from among a pattern of large-diameter conductive vias extending from a top side to a bottom side of a core comprising a dielectric layer;

program instructions for second identifying signal-bearing conductive path profiles for critical signals routed above or below ends of the signal-bearing vias; and program instructions for generating a first mask design for a transmission line reference plane metal layer including voids around the profile of the signal-bearing vias so that capacitive coupling between the ends of the signal-bearing vias and the transmission line reference plane metal layer is substantially reduced, and wherein for the signal-bearing conductive path profiles identified by the second identifying, the program instructions for generating include a conductive stripe extending through the corresponding void.

2. The computer program product of claim 1, further comprising program instructions for further determining widths of the conductive stripes in conformity with a relative criticality of a first signal associated with a given signal-bearing conductive path profile identified by the second identifying to a criticality of second signal associated with a corresponding one of the signal-bearing vias, wherein a width of the conductive stripe corresponding to the given signal-bearing conductive path profile path is increased for increased relative criticality of the first signal.

* * * * *